(12) United States Patent
Callan et al.

(10) Patent No.: US 11,209,257 B2
(45) Date of Patent: Dec. 28, 2021

(54) VOLTAGE POLARITY IMMUNITY USING REVERSE PARALLEL LASER DIODES

(71) Applicant: NORTHROP GRUMMAN SYSTEMS CORPORATION, Falls Church, VA (US)

(72) Inventors: Kevin L. Callan, Manchester, MO (US); Andrew M. Singleton, Manchester, MO (US); Ryan M. Crittenden, O'Fallon, MO (US); Michael L. Fisher, Foley, MO (US); Wade Collins, Wentzville, MO (US); Francis L. Struemph, Villa Ridge, MO (US); Edward F. Stephens, IV, Golden Eagle, IL (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 195 days.

(21) Appl. No.: 16/712,252

(22) Filed: Dec. 12, 2019

(65) Prior Publication Data

US 2021/0278187 A1 Sep. 9, 2021

(51) Int. Cl.
*F42C 19/12* (2006.01)
*F42C 19/08* (2006.01)
*H01S 5/042* (2006.01)

(52) U.S. Cl.
CPC .......... *F42C 19/12* (2013.01); *F42C 19/0823* (2013.01); *H01S 5/042* (2013.01)

(58) Field of Classification Search
CPC .. F42C 19/0823; F42C 19/0815; F42C 19/12; F42B 3/113
See application file for complete search history.

(56) References Cited

U.S. PATENT DOCUMENTS

| 3,362,329 A * | 1/1968 | Epstein | F42B 3/113 |
| | | | 102/201 |
| 3,685,392 A * | 8/1972 | Platt | F42B 3/113 |
| | | | 89/28.05 |

(Continued)

OTHER PUBLICATIONS

Redington, S. et al. "Laser Diode Ignition" NDIA Fuze Conference, May 15-17, 2018.

(Continued)

*Primary Examiner* — Derrick R Morgan
(74) *Attorney, Agent, or Firm* — John A. Miller; Shumaker, Loop & Kendrick, LLP

(57) ABSTRACT

An optical primer for igniting an ignition material in an ammunition cartridge. The primer includes a conductive cylindrical cup electrically coupled to a cartridge case and a circular conductive button including a top button portion positioned in the cup and a bottom button portion extending through an opening in the cup, where the button and the cup are electrically isolated. The primer further includes a first bracket electrically coupled to the button, a second bracket electrically coupled to the cup, and a pair of laser diodes electrically coupled in a reverse parallel direction and being electrically coupled to the first and second brackets, where one of the laser diodes generate a laser beam that ignites the ignition material in response to a current flow in either direction through the case, the cup and the button.

19 Claims, 2 Drawing Sheets

(56) References Cited

U.S. PATENT DOCUMENTS

| | | | | |
|---|---|---|---|---|
| 3,976,012 A * | 8/1976 | Nordgren | .................. | F42C 9/148 |
| | | | | 102/270 |
| 4,135,455 A * | 1/1979 | Wallace | .................. | F42B 5/035 |
| | | | | 102/217 |
| 4,619,202 A * | 10/1986 | Romer | .................... | F42B 5/02 |
| | | | | 102/443 |
| 5,206,455 A * | 4/1993 | Williams | ................ | F42B 3/113 |
| | | | | 102/201 |
| 5,212,339 A * | 5/1993 | Piltch | .................... | F42B 3/113 |
| | | | | 102/201 |
| 5,473,623 A * | 12/1995 | Fahey | ................... | F42B 3/113 |
| | | | | 372/38.07 |
| 5,488,908 A * | 2/1996 | Gilpin | ................... | F42D 1/045 |
| | | | | 102/200 |
| 6,166,452 A * | 12/2000 | Adams | .................. | F42B 3/198 |
| | | | | 307/10.1 |
| 6,199,483 B1 * | 3/2001 | Barbiche | ................ | F42B 3/113 |
| | | | | 102/201 |
| 6,499,404 B1 | 12/2002 | Kern et al. | | |
| 6,910,420 B1 * | 6/2005 | Thompson | ............. | C06B 33/00 |
| | | | | 102/202.5 |
| 7,732,825 B2 | 6/2010 | Kim et al. | | |
| 8,390,979 B2 * | 3/2013 | Hurley | .................. | F42D 1/055 |
| | | | | 361/232 |
| 8,544,203 B2 * | 10/2013 | Jackson | ................. | F41A 33/02 |
| | | | | 42/116 |
| 8,646,387 B2 * | 2/2014 | Schlenter | .......... | H03K 17/6874 |
| | | | | 102/217 |
| 9,273,942 B1 | 3/2016 | Burke et al. | | |
| 9,470,490 B2 * | 10/2016 | Vabnick | ................ | G09B 5/02 |
| 9,568,276 B2 * | 2/2017 | Jackson | ................ | F42B 5/02 |
| 9,618,307 B1 | 4/2017 | Redington et al. | | |
| 9,829,289 B1 * | 11/2017 | Burke | ................ | F42C 19/0807 |
| 9,909,847 B1 | 3/2018 | Burke et al. | | |
| 10,234,248 B1 * | 3/2019 | Hoang | ................. | F42C 11/02 |
| 10,415,942 B1 * | 9/2019 | Redington | ............... | F42B 5/08 |
| 10,415,944 B2 * | 9/2019 | Winter | .................. | F42C 19/12 |
| 10,782,113 B2 * | 9/2020 | Brundula | ............... | F42C 19/12 |

OTHER PUBLICATIONS

U.S. Army Armament Research & Engineering Center. "Laser Diode Ignition" Jan. 31, 2018.

* cited by examiner

VOLTAGE POLARITY IMMUNITY USING REVERSE PARALLEL LASER DIODES

BACKGROUND

Field

This disclosure relates generally to an optical based ammunition primer and, more particularly, to an optical based ammunition primer for an ammunition cartridge, where the primer includes a pair of laser diodes electrically coupled in a reverse parallel direction.

Discussion of the Related Art

Ammunition cartridges come in a variety of sizes, shapes and calibers to be used in various weapons for various military and sport applications. A typical ammunition cartridge includes a case, a primer, gun powder and a projectile or bullet. The primer is provided and exposed at one end of the case, the powder is contained within the case and the bullet is secured to and extends from an opposite end of the case from the primer. The primer includes a chemical compound that explodes when struck by a firing pin in the weapon that creates a mechanical shock (percussion) that ignites the gun powder, which causes the bullet to be discharged at a high velocity.

It is known in the art to replace the mechanical initiated primer with an electrical initiated primer. A typical electrical initiated primer includes a resistive element that heats a chemical compound when the element is electrically energized in response to contact with the firing pin. The chemical compound explodes from the heat, which ignites the gun powder and causes the bullet to be discharged. Electrical initiated primers have several characteristics that, depending on the application, can make them desirable over mechanical initiated primers. Further, the electrical firing mechanism weighs less, which can be advantageous in airborne applications where light weight is a priority. Similarly, moving less mass and not having to hold back a forceful spring can contribute to a quicker mechanism firing rate. Likewise, because the electrical firing pin only has to touch the primer, rather than forcefully strike it, the electrical initiated primer can reduce aiming instabilities. Also, some electrically initiated propellants provide quicker action time of the ammunition.

However, this type of electrical ignition primer is susceptible to electromagnetic phenomenon, such as electro-static discharge (ESD) and hazards of electromagnetic radiation to ordinance (HERO) both from friendly systems as well as from adversaries, such as the case with electromagnetic pulses (EMPs). Any of these electromagnetic environmental effects can cause the electrically initiated primer to prematurely explode. In order to reduce the susceptibility to these effects, reduce complexity and increase reliability of ammunition cartridges, it has been proposed in the art to replace the electrical ignition primer with an optical ignition primer where a laser provides the energy that ignites the gun powder.

DETAILED DESCRIPTION OF THE EMBODIMENTS

The following discussion of the embodiments of the disclosure directed to an optical based ammunition primer is merely exemplary in nature, and is in no way intended to limit the disclosure or its applications or uses.

Figure 1:
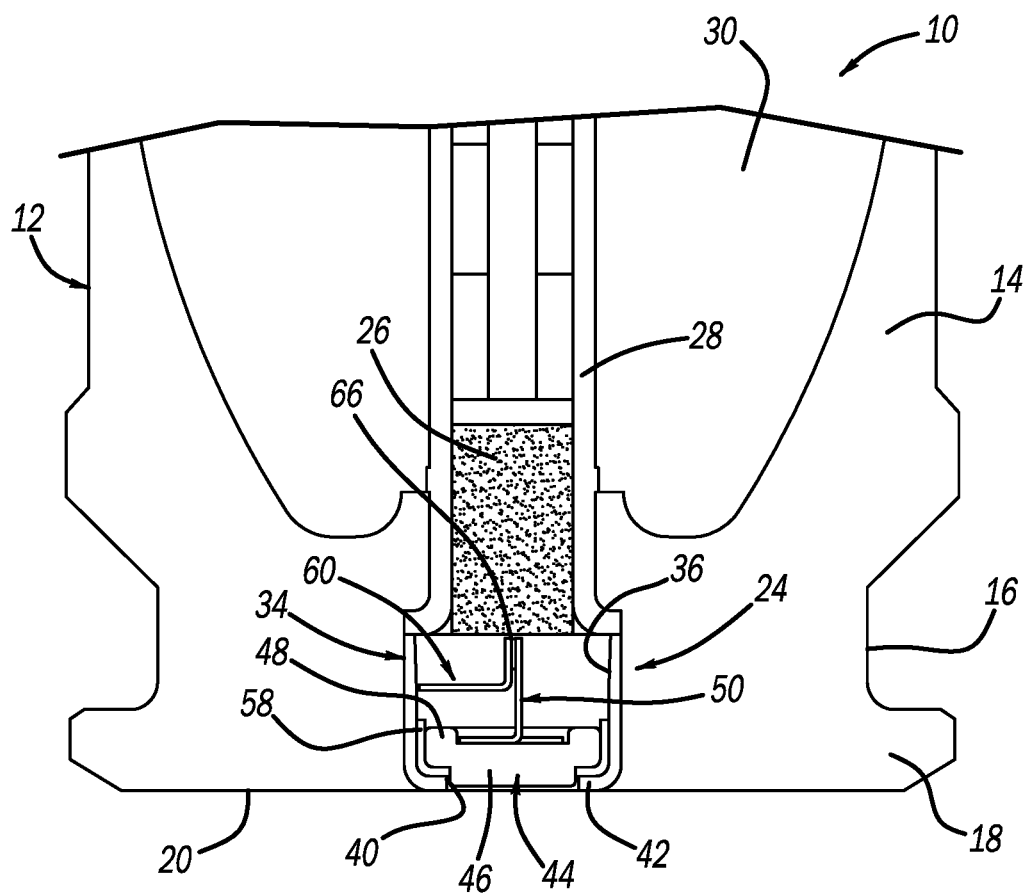
FIG. 1 is a cut-away, cross-sectional type view of a lower portion of an ammunition cartridge including an optical based primer.

FIG. 1 is a cut-away, cross-sectional type view of a lower portion of an ammunition cartridge 10, here a 30 mm cartridge, including an outer case 12 made of a suitable metal. The case 12 includes a cylindrical body 14 having an indentation 16 defining a rim 18 at a bottom end 20 of the case 12. An optical primer 24 is provided at the center of the case 12 so that it is exposed at the bottom end 20 of the case 12. An ignition material 26 is provided in a tube 28 at the center of the case 12 adjacent to and on top of the primer 24 and a cavity 30 is provided around the tube 28 in which the gun powder (not shown) is provided. As will be discussed below, a laser within the primer 24 creates a laser beam that ignites the ignition material 26, where the ignited material travels though the tube 28 and into the cavity 30 to ignite the powder to release a projectile (not shown).

Figure 2:
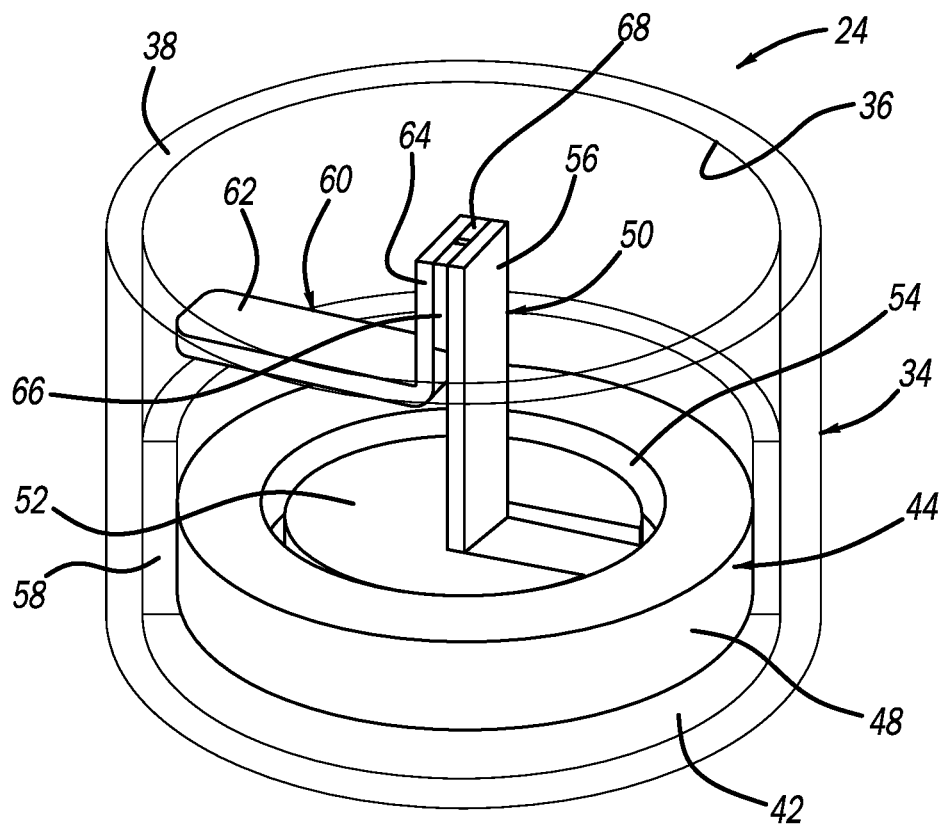
FIG. 2 is an isometric view of the primer separated from the cartridge.
Figure 3:
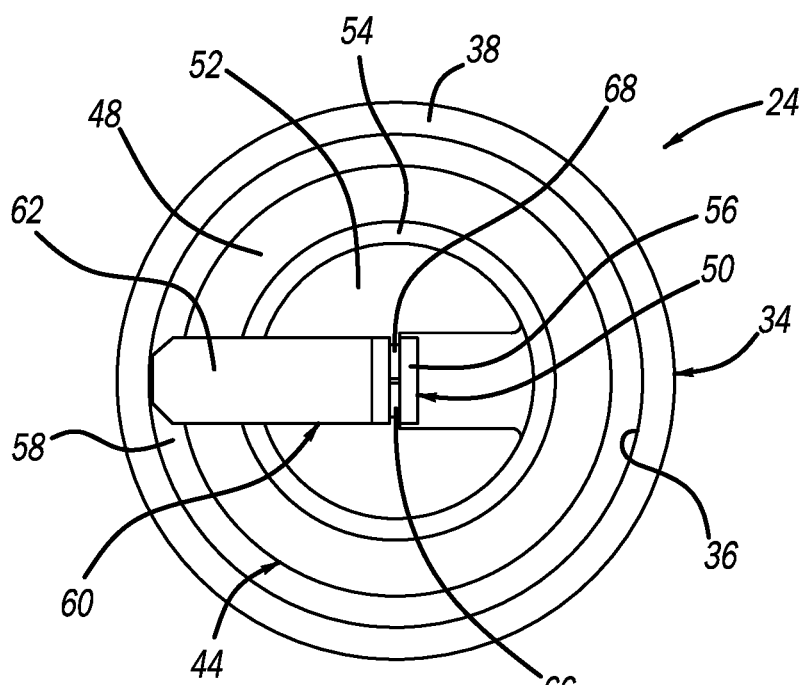
FIG. 3 is a top view of the primer separated from the cartridge.

FIG. 2 is an isometric view and FIG. 3 is a top view of the primer 24 separated from the cartridge 10. The primer 24 includes a cylindrical metal cup 34, shown as being transparent merely for illustration purposes, defining a cylindrical chamber 36 and having an open top end 38 and an opening 40 at a bottom end defined by a flange 42, where the cup 34 is in electrical contact with the case 12. A conductive button 44 is positioned within the cup 34 and includes a circular portion 46 seated within the opening 40 and being exposed at the bottom end of the case 12 and a circular portion 48 positioned within the chamber 36. An insulating ring 58 is positioned between the cup 34 and the button 44 so that they are not in electrical contact with each other. A first L-shaped conductive bracket 50 positioned within the chamber 36 and that includes a circular plate 52 secured within a recess 54 of and being electrically coupled to the circular portion 48 and a tab 56 extending up from the plate 52. A second L-shaped conductive bracket 60 positioned within the chamber 36 and that includes an arm 62 electrically coupled to the cup 34 and a tab 64 positioned adjacent to but spaced from the tab 56. A pair of spaced apart laser diodes 66 and 68 are secured to and positioned in the space between the tabs 64 and 56, as shown, where the laser diodes 66 and 68 are a type of diode that when electrically energized generate a high intensity laser beam directed from the diodes 66 and 68 in a particular direction, here upward towards the ignition material 26. Although laser diodes are used in this embodiment, other lasers and light emitting devices may be applicable in other embodiments, such as P-N junction devices including LEDs, vertical cavity surface emitting lasers (VSCELs), etc. It is noted that at least one of the brackets 50 or 60 has enough thermal mass so as to allow the laser diodes 66 and 68 to be energized at full power to test the primer 24 without damaging the primer 24.

Figure 4:
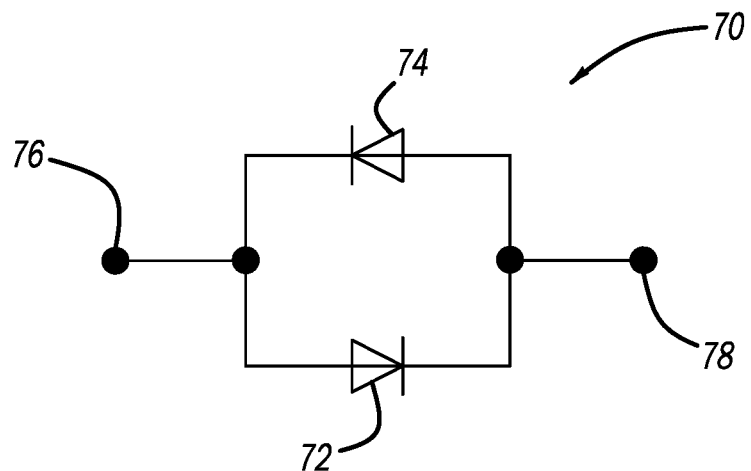
FIG. 4 is an electrical schematic diagram of the primer showing the laser diodes in the primer.

FIG. 4 is a schematic diagram 70 of the primer 24 including a pair of laser diodes 72 and 74, representing the laser diodes 66 and 68, electrically coupled in parallel and in a reverse manner to a terminal 76 representing the button 44 and a terminal 78 representing the cup 34 so that only one of the diodes 72 and 74 conducts depending on the direction of the current flow between the terminals 76 and 78. Therefore, if a positive voltage is applied to cause current to flow into the circular portion 46 of the button 44, the laser diode 72 will conduct, which causes the ignitable material 26 to explode and ignite the powder, and if a negative voltage is applied to an electrode (not shown) attached to the case 12 to cause current to flow into the case 12, the laser diode 74 will conduct and cause the ignitable material 26 to explode and ignite the powder. Thus, the ignitable material 26 will ignite the powder for voltage of either polarity and thereby current flow in either direction from the case 12, through the brackets 50 and 60 to the button 44 or from the button 44, through the brackets 50 and 60 to the case 12, which allows the cartridge 10 to be used in weapons that provide such voltage of either polarity and current flow in either direction.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. An optical primer for igniting an ignition material contained in a case that is part of an ammunition cartridge, said primer comprising: a conductive cylindrical cup electrically coupled to the case, said cup including an open top end and a bottom end exposed at a bottom of the case, said bottom end of the cup including a circular opening; a circular conductive button electrically isolated from the cup; a first conductive bracket positioned within the cup and being electrically coupled to the button; a second conductive bracket positioned within the cup and being electrically coupled to the cup; and at least one light emitting device electrically coupled to the first and second brackets, said at least one light emitting device generating a light beam that ignites the ignition material in response to a current flow through the case, the cup and the button; and
    wherein the first bracket is an L-shaped bracket including a circular bottom portion secured to the button and a tab extending upward in the cup and the second bracket is an L-shaped bracket including an arm coupled to the cup and a tab also extending upward in the cup, said at least one light emitting device being coupled between and to the tabs.

2. The optical primer according to claim 1 wherein the at least one light emitting device is a pair of light emitting devices that are electrically configured in a reverse parallel direction so that one of the light emitting devices conducts if the current flow is from the case to the button and the other light emitting device conducts if the current flow is from the button to the case.

3. The optical primer according to claim 1 wherein the at least one light emitting device is a laser diode.

4. The optical primer according to claim 1 wherein the at least one light emitting device is a P-N junction device.

5. The optical primer according to claim 4 wherein the P-N junction device is an LED or a vertical cavity surface emitting laser (VSCEL).

6. The optical primer according to claim 1 wherein the circular bottom portion is secured within a circular recess in the button.

7. The optical primer according to claim 1 wherein at least one of the first or second bracket has enough thermal mass so as to allow the primer to be tested at full power without damaging the primer.

8. The optical primer according to claim 1 wherein the button includes a top button portion positioned in the cup and bottom button portion extending through the opening.

9. The optical primer according to claim 1 wherein the ignitable material is positioned directly above the open top end of the cup in the case.

10. The optical primer according to claim 1 wherein the cartridge is a 30 mm cartridge.

11. An optical primer for igniting an ignition material contained in a case that is part of an ammunition cartridge, said primer comprising a pair of light emitting devices that are electrically configured in a reverse parallel direction so that one of the devices conducts for current flow in one direction and the other device conducts for current flow is in an opposite direction.

12. The optical primer according to claim 11 wherein the light emitting devices are laser diodes or P-N junction devices.

13. The optical primer according to claim 11 further comprising a cylindrical cup electrically coupled to the case, said pair of light emitting devices being positioned within the cup.

14. The optical primer according to claim 13 further comprising a circular conductive button positioned within and being electrically isolated from the cup.

15. The optical primer according to claim 14 further comprising a first L-shaped bracket positioned within the cup and including a circular bottom portion secured to the button and a tab extending upward in the cup and a second L-shaped bracket positioned within the cup and including an arm coupled to the cup and a tab also extending upward in the cup, said pair of light emitting devices being coupled between and to the tabs.

16. The optical primer according to claim 13 wherein the ignitable material is positioned directly above an open top end of the cup in the case.

17. An ammunition cartridge comprising:
    a case;
    an ignitable material contained within the case; and
    an optical primer positioned within the case for igniting the ignition material, said primer including a conductive cylindrical cup electrically coupled to the case, said cup including an open top end and a bottom end exposed at a bottom of the case, said bottom end of the cup including a circular opening, said primer further including a circular conductive button having a top button portion positioned in the cup and bottom button portion extending through the opening, said button and cup being electrically isolated, said primer further including a first L-shaped conductive bracket positioned within the cup and being electrically coupled to the button, a second L-shaped bracket positioned within the cup and being electrically coupled to the cup, and a pair of laser diodes positioned within the cup that are electrically configured in a reverse parallel direction so that one of the diodes conducts for current flow in one direction and the other diode conducts if the current flow is in an opposite direction, said laser diodes generating a laser beam that ignites the ignition material in response to the current flow.

18. The ammunition cartridge according to claim 17 wherein the first bracket is secured within a circular recess in the button.

19. The ammunition cartridge according to claim 17 wherein the ignitable material is positioned directly above the open top end of the cup in the case.

* * * * *